United States Patent [19]
Ishikawa

[11] Patent Number: 5,814,153
[45] Date of Patent: Sep. 29, 1998

[54] SEMICONDUCTOR DEVICE MANUFACTURING APPARATUS

[75] Inventor: Yoshimitsu Ishikawa, Nagaskai, Japan

[73] Assignee: Sony Corporation, Tokyo, Japan

[21] Appl. No.: 884,500

[22] Filed: Jun. 27, 1997

Related U.S. Application Data

[62] Division of Ser. No. 615,778, Mar. 14, 1996, Pat. No. 5,693,579.

[30] Foreign Application Priority Data

Mar. 15, 1995 [JP] Japan .................................. 7-084704

[51] Int. Cl.$^6$ .................................................. C23C 16/00
[52] U.S. Cl. .......................... 118/719; 118/724; 118/725; 118/729; 118/715
[58] Field of Search .................... 118/719, 724, 118/725, 729, 715

[56] References Cited

U.S. PATENT DOCUMENTS 5,518,962  5/1996  Murao ...................... 437/195

Primary Examiner—Richard Bueker
Attorney, Agent, or Firm—Hill & Simpson

[57] ABSTRACT

To provide a semiconductor device manufacturing method and a semiconductor device manufacturing apparatus in which both a dependency on base material and a film characteristic are satisfied in film forming steps of the semiconductor manufacturing. There are provided a first film forming part 4 and a second film forming part 5 along a transporting direction A in the transporting system 1 for the semiconductor substrate 2, the first film forming part 4 is provided with a post-mixed type gas supplying means 7 for supplying a plurality of kinds of reaction gases onto a semiconductor substrate while the gases are being separated from each other through an inert gas, and the second film forming part 5 is provided with a premixed type gas supplying means 8 for supplying the mixture gas onto the semiconductor substrate while a plurality of kinds of reaction gases are mixed in advance.

13 Claims, 3 Drawing Sheets

SEMICONDUCTOR DEVICE MANUFACTURING APPARATUS

This is a divisional of application Ser. No. 08/615,778, filed Mar. 14, 1996 now U.S. Pat. No. 5,693,579.

BACKGROUND OF THE INVENTION

1. Field of the Invention

This invention relates to a semiconductor manufacturing method and a semiconductor manufacturing apparatus. More particularly, the present invention relates to a semiconductor manufacturing method and a semiconductor manufacturing apparatus in which a dependency of a formed film on its substrate is decreased and a film quality characteristic is improved under a combination of the reaction gas supplying system.

2. Description of Related Art

In the semiconductor device manufacturing steps, various kinds of thin films are formed on a semiconductor substrate (a wafer) under application of the CVD device. This CVD device is operated such that reaction gas is supplied onto a wafer set on a wafer transporting passage or within a reaction chamber kept at a normal pressure or a reduced pressure state so as to form a thin film on the wafer through a gaseous phase growth or a chemical reaction. In the case that the reaction gas is composed of a plurality of kinds of gases, there may be employed a post-mixed type gas supplying system and a premixed type gas supplying system.

The post-mixed type gas supplying system is a system in which each of the gases is separated from each other through inert gas such as $N_2$ or the like until just before a plurality of kinds of reaction gases reach the wafer. Although the thin film formed through this system has a low dependency of substrate and shows a substantial uniform film formed state such as a film thickness or a film shape and the like whatever material quality or state of the substrate may be applied, the film characteristic is reduced and an amount of moisture contained in the thin film is increased.

The premixed type gas supplying system is a system in which a plurality of kinds of reaction gases are mixed in advance within a premixing chamber before they reach the wafer and the mixture gas is supplied to the wafer. The thin film formed by this system has a superior film characteristic and less amount of moisture contained in the thin film, although its dependency on substrate becomes high in turn and a uniform film forming state is hardly obtained.

In the related art CVD device, either one of the post-mixed type gas supplying system or the premixed type gas supplying system was applied to form a thin film on the wafer, resulting in that both dependency on substrate and film characteristic could not be sufficiently satisfied and it was hard to get a thin film having a superior characteristic under a desired film forming state.

SUMMARY OF THE INVENTION

The present invention has been completed in view of the foregoing and it is an object of the present invention to provide a semiconductor device manufacturing method and a semiconductor device manufacturing apparatus in which both dependency on substrate and film characteristic are fulfilled during the film forming step for the semiconductor manufacturing process.

In order to accomplish the aforesaid object, the present invention provides a semiconductor device manufacturing method in which a plurality of kinds of reaction gases are supplied onto the semiconductor substrate (wafer) to form a film on the semiconductor, and the plurality of kinds of reaction gases are supplied onto the semiconductor substrate while they are being separated from each other through inert gas so as to form the first layer on the semiconductor substrate, then the plurality of kinds of reaction gases are supplied onto the semiconductor substrate while they are being mixed from each other and to form the second layer having the same film forming material as that of the first layer.

In addition, the present invention provides a semiconductor device manufacturing apparatus in which there are provided a first film forming part and a second film forming part along a transporting direction of the transporting system for the semiconductor substrate, the first film forming part is provided with a post-mixed type gas supplying means for supplying a plurality of kinds of gases onto the semiconductor substrate while they are being spaced apart from each other through an inert gas, and the second film forming part is provided with the premixed type gas supplying means for supplying the mixed gases onto the semiconductor substrate while a plurality of kinds of reaction gases are being premixed in advance.

At first, the thin film of the first layer having a low dependency on substrate is formed on the base material of the semiconductor substrate by the post-mixed gas supplying system. Then, the second layer of the same film forming material as that of the first layer having the superior film forming characteristic is formed on the first layer by the premixed gas supplying system. A desired thin film is formed on the semiconductor substrate with these first and second layers being stacked up from each other.

DESCRIPTION OF THE PREFERRED EMBODIMENTS

Figure 1:
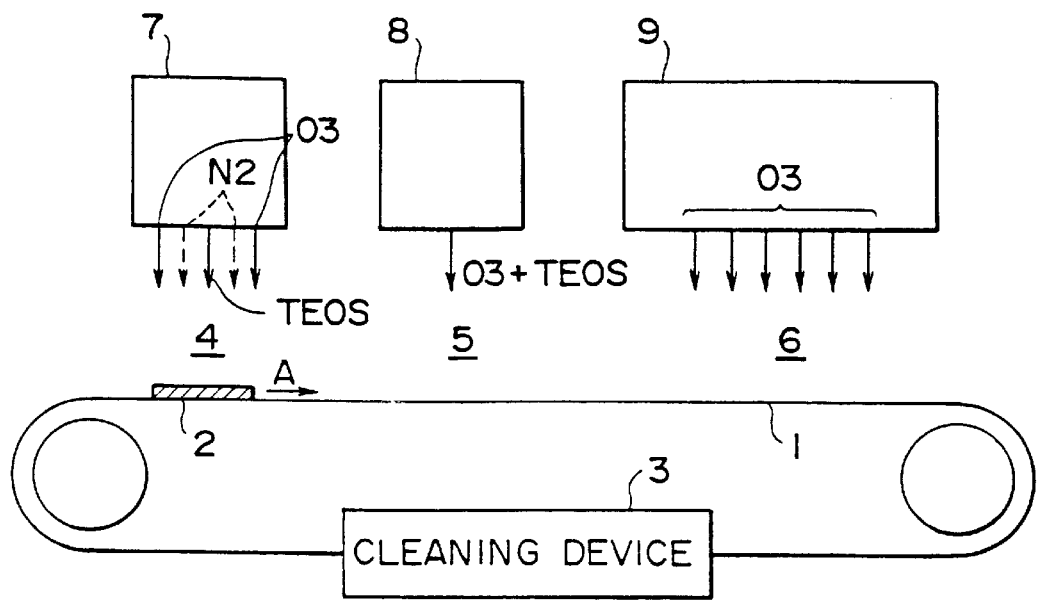
FIG. 1 is a configuration figure for showing the semiconductor manufacturing apparatus constructed in accordance with the present invention.

FIG. 1 is a configuration figure for showing the semiconductor manufacturing apparatus constructed in accordance with the present invention. This preferred embodiment relates to a preferred embodiment in which an NSG (Non-doped Silicate Glass) film composed of a Si oxidization film acting as an interlayer film is formed in a series of layer stacking processes for forming the interlayer film and forming an electrical wiring pattern on the former film after forming an element region or an electrode or the like on a semiconductor substrate. In the case that such an NSG film as described above is formed, ozone ($O_3$) and TEOS (Tetra Ethoxy Silane:Si $(OC_2H_5)_4$ are applied as reaction gases in a normal pressure CVD method. TEOS is kept in a liquid state at a room temperature and this liquid is heated at a temperature of about 30° C., evaporated and supplied to a film forming part (a reacting position) together with carrier gas. This TEOS is heated at the film forming part at a temperature of about 300° to 600° C., decomposed and then forms an NSG film of a Si oxidizing film on the wafer.

At first, a configuration of the apparatus of the preferred embodiment of the present invention will be described as follows. The configuration of the apparatus of the preferred embodiment of the present invention is illustrated in FIG. 1. A wafer 2 is mounted on a transporting system 1 comprised of a conveyor belt or a continuous tray. The transporting system 1 is provided with a cleaning device 3 for use in cleaning a wafer mounting surface. Both a first film forming part 4 and a second film forming part 5 are arranged along a transporting direction (an arrow A) in the transporting system 1 and subsequently a cooling part 6 is installed. Each of the first film forming part 4 and the second film forming part 5 is constituted as a normal pressure CVD device.

The first film forming part 4 is provided with a post-mixed type gas supplying means 7 and the second film forming part 5 is provided with a premixed type gas supplying means 8, respectively. In addition, the cooling part 6 is provided with a cooling gas supplying means 9.

Figure 2:
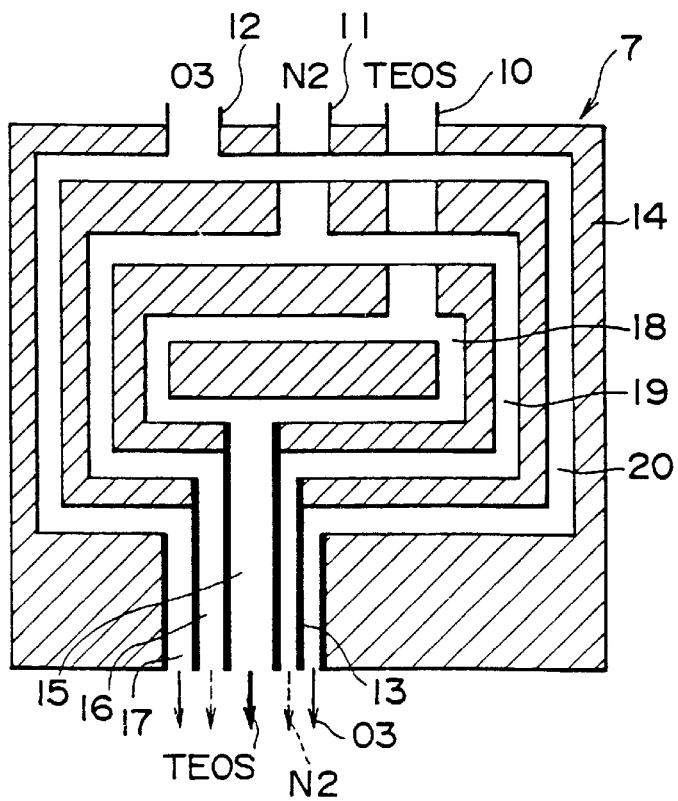
FIG. 2 is a configuration figure for showing a post-mixed type gas supplying means.

In FIG. 2 is illustrated a configuration of he post-mixed type gas supplying means 7. A plurality of divided plates 14 (this figure shows plates assembled from each other) are properly stacked to each other and also combined so as to cause a TEOS passage 18, a nitrogen gas passage 19 and an ozone gas passage 20 to be separately formed to each other. At the inlet of each of the passages 18, 19 and 20 is arranged each of three gas feeding inlets 10, 11 and 12 connected to each of the pipes (not shown) of TEOS, nitrogen and ozone, respectively, and further at each of the outlets of the passages is formed each of gas discharging ports 15, 16 and 17 of TEOS, nitrogen and ozone which are separated from each other by slits 13.

Figure 3:
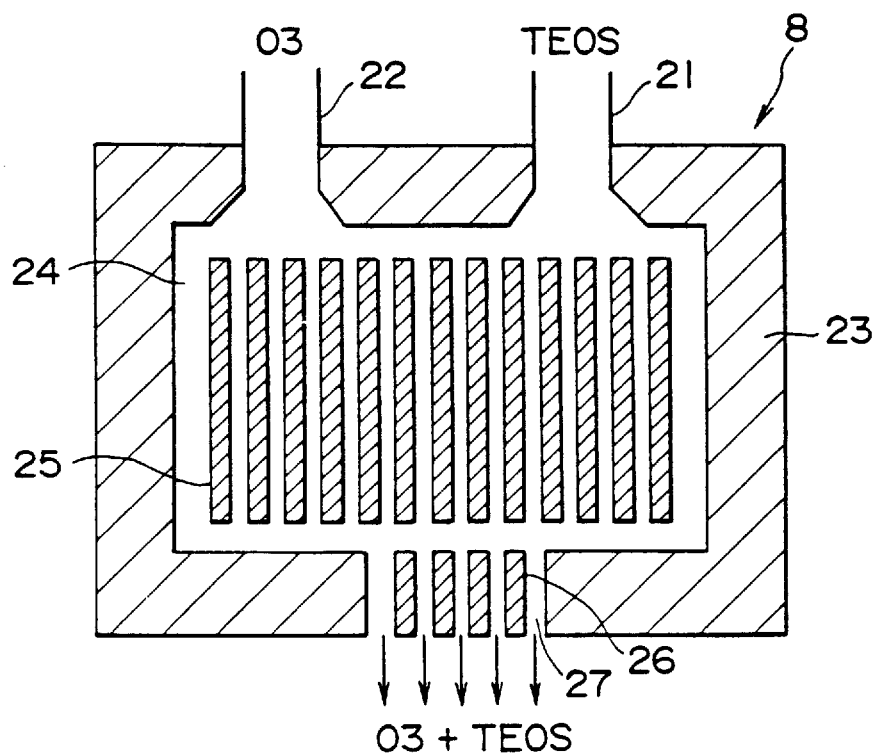
FIG. 3 is a configuration figure for showing a premixed type gas supplying means.

In FIG. 3 is illustrated a configuration of a premixed type gas supplying means 8. A plurality of divided plates 23 (the figure shows the assembled state of the plates) are properly stacked to assemble from each other and a pre-chamber 24 is formed within the plates. The pre-chamber 24 has a plurality of slits 25 arranged in side-by-side relation for regulating flow in it, its inlet side has two gas feeding ports 21, 22 connected to each of the pipes (not shown) for TESO and ozone and its outlet side has gas discharging ports 27 provided with flow regulating slits 26.

The clean gas supplying means 9 may be constructed such that ozone gas is supplied from the ozone supplying pipe onto the wafer through a flow regulating means such as a punched metal and the like or may be constructed such that the aforesaid post-mixed type gas supplying means 7 or the premixed type gas supplying means 8 are applied to open only the gas feeding inlets 12, 22 connected to the ozone pipe and close the other one or may be constructed such that the ozone pipe may be opened merely on the wafer through a requisite valve and the like.

A method for forming an NSG film on a wafer by the semiconductor manufacturing apparatus having the aforesaid configuration will be described as follows.

Figure 4:
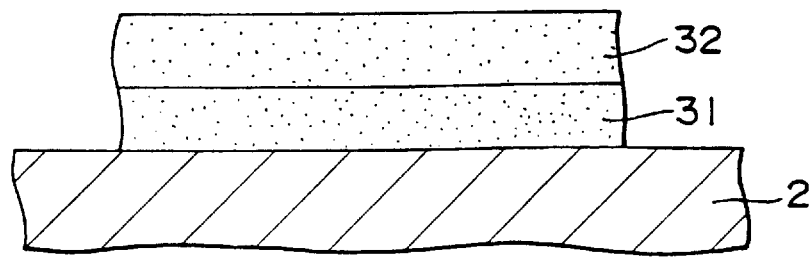
FIG. 4 is an illustrative view for showing a film forming method of the present invention.

A wafer 2 transported by the transporting system 1 in a direction of arrow A reaches at first the first film forming part 4. Each of TEOS, nitrogen and ozone gases is supplied onto the wafer 2 by the post-mixed type gas supplying means 7 with each of them being separated from each other while the wafer is passing through the first film forming part 4. That is, TEOS and ozone acting as reaction gas are supplied onto the wafer 2 while they are separated from each other by nitrogen gas. With such an arrangement as above, as shown in FIG. 4, an NSG film 31 of the first layer is formed on the wafer 2 having element regions or electrodes (they are not shown) with the wafer being applied as a base material. Since this NSG film 31 of the first layer is formed by the post-mixed type CVD process, its dependency on the base material is low and a uniform NSG first layer 31 is formed on the wafer 2.

Film forming conditions of the first layer 31 with the post-mixed type operation are as follows.
380° to 400° C.
TEOS=16 sccm
$O_3$=8 slm (a concentration of 107 mg/sl)

As described above, as the first layer 31 having a predetermined film thickness is formed while passing through the first film forming part 4, the wafer 2 is further continuously transported by the transporting system 1 from the first film forming part 4 and reaches the second film forming part 5. Mixed reaction gas of TEOS and ozone mixed by the premixed type gas supplying means 8 within the pre-chamber 24 while passing through the second film forming part 5 is supplied onto the wafer 2 under a state in which a flow of the reaction gas is regulated. In this way, as shown in FIG. 4, the second layer 32 of the same NSG is formed on the first layer 31 of NSG on the wafer 2. Since this NSG film 32 of the second layer is formed by a premixed type CVD process, the second layer 32 of NSG with a superior film characteristic and less amount of moisture content is formed.

Film forming conditions for this premixed type second layer are as follows.
380° to 400° C.
TEOS=120 sccm
$O_3$=37 SLM (a concentration of 120 mg/sl)

In this way, as the second layer 32 having a predetermined film thickness is formed during passing through the second film forming part 5, the wafer 2 is further continuously transported by the transporting system 1 and reaches the cooling part 6. Ozone is supplied onto the wafer 2 by the cooling gas supplying means 9 during passing through the cooling part, and the wafer 2 heated by the first and second film forming parts 4 and 5 of the previous stages. Ozone may act against the surface of the NSG film formed into a film shape to promote its oxidization in concurrent with this cooling action, resulting in that the surface layer may have a more complete $SiO_2$.

A cooling condition within the cooling chamber 6 is as follows.
$O_3$=50 SLM (a concentration of 120 mg/sl)

Figure 5:
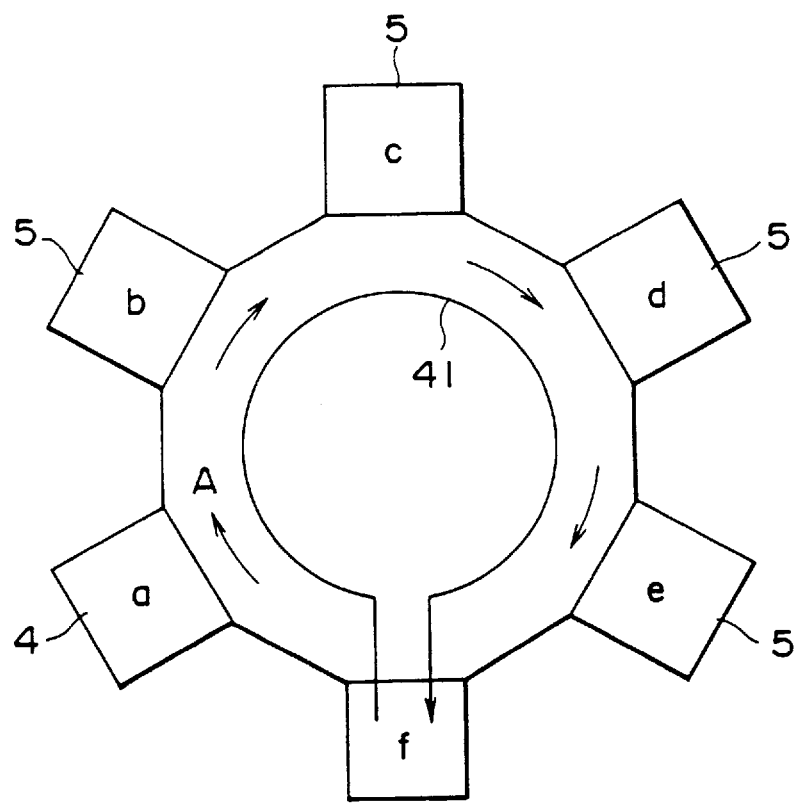
FIG. 5 is a configuration figure for showing the semiconductor manufacturing apparatus of another preferred embodiment of the present invention.

FIG. 5 is a configuration figure for showing another preferred embodiment of the present invention. In this preferred embodiment, a preheating chamber (f) and five CVD devices (a) to (e) are arranged in a circular form and at the central part in the circle is installed a transporting system 41 comprised of a robot hand (not shown) for use in loading or unloading the wafer. The first CVD device (a) constitutes the aforesaid first post-mixed type film forming part 4 along the transporting direction (the arrow A) in the transporting system 41, the second t the fifth CVD devices (b) to (e) may constitute the second premixed type film forming part 5.

In such an arrangement as above, the wafer (not shown) transported from outside is at first preheated up to a predetermined temperature by the preheating chamber (f). Then, the wafer is transported into the first post-mixed type film forming part 4, and the first layer of NSG film having a predetermined thickness is formed. As described above, this first layer is a layer having a low dependency for the substrate. Upon completion of the processing at the initial CVD device (a), the wafer is taken out and transported into the adjoining second premixed type film forming part 5 (the CVD device (b)) by the transporting system 41. In this case, the second layer of NSG film having a predetermined thickness is formed by the premixed process. As described above, the second layer is a layer having a superior film forming characteristic. In addition, as required, the third to fifth NSG films are formed by the premixed processing on the second layer with application of the CVD devices (c), (d) and (e). With such an arrangement as above, the NSG film having a desired thickness is formed.

The aforesaid preferred embodiment has been described with reference to the film formation of the NSG film, although the present invention may also be applicable to the film formation of BPSG film or PSG film. However, in view of improvement in dependency on the substrate, a substantial effect can be attained if the present invention is applied to the NSG film. In addition, the present invention can be applied not only to the CVD device but also a spattering device or a vacuum depositing device or another semiconductor manufacturing device using several kinds of reaction gases. As described above, the present invention may have an effect to decrease a dependency on the substrate and to improve a film characteristic during a film forming process due to the fact that both post-mixed type and premixed type gas supplying means are applied together. With such an arrangement as above, a coverage can be improved, a fine machining margin can be expanded, a semiconductor element having a superior characteristic can be formed and a reliability in operation of the device can be improved during the interlayer film forming process.

What is claimed is:

1. A semiconductor device manufacturing apparatus comprising:

a transporting part for transporting a semiconductor substrate;

a first film forming part and a second film forming part arranged along a transporting direction of said semiconductor substrate in said transporting part;

said first film forming part being provided with a gas supplying means for supplying gases onto said semiconductor substrate while a plurality of reaction gases are being separated from each other through an inert gas; and said second film forming part being provided with a gas supplying means for supplying premixed mixture gas having said plurality of reaction gases onto the semiconductor substrate.

2. The semiconductor device manufacturing apparatus of claim 1 wherein said first film forming part further comprising a first port for delivering a first reaction gas to the semiconductor substrate, a second port for delivering a second reaction gas to the semiconductor substrate and a third port for delivering nitrogen gas to the semiconductor substrate, the third port being disposed between the first and second ports.

3. The semiconductor device manufacturing apparatus of claim 1 wherein the first film forming part maintains the temperature of the substrate surface within a range of from about 380° C. to about 400° C.

4. The semiconductor device manufacturing apparatus of claim 1 wherein said second film forming part maintains the temperature of the substrate surface within a range of from about 380° C. to about 400° C.

5. The semiconductor device manufacturing apparatus of claim 1 further comprising a preheating part for preheating the substrate prior to the transport of the substrate to the first film forming part.

6. The semiconductor device manufacturing apparatus of claim 1 wherein the plurality of reaction gases comprises ozone and tetraethoxysilane.

7. The semiconductor device manufacturing apparatus of claim 6 wherein said first film forming part delivers the ozone to the substrate surface at a rate of about 8 slm and at a concentration of about 107 mg/sl.

8. The semiconductor device manufacturing apparatus of claim 6 wherein the first film forming part delivers the tetraethoxysilane to the substrate surface at a rate of about 16 sccm.

9. The semiconductor device manufacturing apparatus of claim 6 wherein said second film forming part delivers ozone to the substrate surface at a rate of about 37 slm and at a concentration of about 120 mg/sl.

10. The semiconductor device manufacturing apparatus of claim 6 wherein said second film forming part delivers the tetraethoxysilane to the substrate surface at a rate of about 120 sccm.

11. The semiconductor device manufacturing apparatus of claim 1 further comprising a cooling part for cooling the substrate after the formation of the first and second films with a flow of cooling gas.

12. The semiconductor device manufacturing apparatus of claim 11 wherein the cooling gas is ozone.

13. The semiconductor device manufacturing apparatus of claim 11 wherein said cooling part supplies the ozone to the substrate, first film and second film at a rate of about 50 slm.

* * * * *